United States Patent
Nilsson et al.

(10) Patent No.: US 12,180,592 B2
(45) Date of Patent: Dec. 31, 2024

(54) DEVICE AND METHOD FOR ENSURING PLANARITY OF A SEMICONDUCTOR WAFER DURING EPITAXIAL GROWTH

(71) Applicant: EPILUVAC AB, Lund (SE)

(72) Inventors: Roger Nilsson, Lund (SE); Richard Spengler, Lund (SE)

(73) Assignee: EPILUVAC AB, Lund (SE)

( * ) Notice: Subject to any disclaimer, the term of this patent is extended or adjusted under 35 U.S.C. 154(b) by 601 days.

(21) Appl. No.: 17/594,235

(22) PCT Filed: Apr. 8, 2020

(86) PCT No.: PCT/SE2020/050367
§ 371 (c)(1),
(2) Date: Oct. 7, 2021

(87) PCT Pub. No.: WO2020/209780
PCT Pub. Date: Oct. 15, 2020

(65) Prior Publication Data
US 2022/0136109 A1    May 5, 2022

(30) Foreign Application Priority Data
Apr. 12, 2019   (SE) ................................ 1930124-1

(51) Int. Cl.
*C23C 16/52*         (2006.01)
*C23C 16/458*        (2006.01)
(Continued)

(52) U.S. Cl.
CPC .......... *C23C 16/52* (2013.01); *C23C 16/4584* (2013.01); *C23C 16/46* (2013.01);
(Continued)

(58) Field of Classification Search
CPC ......... H01L 21/67126; H01L 21/67167; H01L 21/67207; H01L 21/67103; H01L 21/6719;
(Continued)

(56) References Cited

U.S. PATENT DOCUMENTS 5,851,929 A * 12/1998 Thakur ............. H01L 21/67115
                                                  438/795
7,331,583 B1 * 2/2008 Andre ................... B23B 31/402
                                                  269/22
(Continued)

FOREIGN PATENT DOCUMENTS

EP      1275135 B1    3/2008
JP      5259082 A    10/1993
(Continued)

OTHER PUBLICATIONS

Supplementary European Search Report in corresponding European Application No. EP 20 78 7524 dated Nov. 2, 2022 (2 pages).
(Continued)

*Primary Examiner* — Caleb E Henry
(74) *Attorney, Agent, or Firm* — Jeffri A. Kaminski; Venable LLP

(57) ABSTRACT

A device to ensure planarity of a semiconductor wafer during growth at an increased temperature in a growth chamber arranged in a reactor housing where the device includes a growth chamber having a port to allow the deposition of at least one wafer on a rotating susceptor in the growth chamber and the withdrawal of the wafer. The growth chamber has an inlet channel for a supply of process gases and an outlet channel for a discharge of not consumed process gases to create a process gas flow between said channels. Separate heaters are adjacent to the growth chamber to heat the rotating wafer with individually controlled heating zones both above and under the wafer. An instru- (Continued)

ment measures the bending of the wafer, and an automatic control circuit uses data from temperature sensors or measured data of power supplied to the heaters and the instrument measuring bending of the wafer to change the temperature in said temperature zones so that bending of the wafer is minimized.

9 Claims, 2 Drawing Sheets

(51) Int. Cl.
    *C23C 16/46*     (2006.01)
    *H01L 21/02*     (2006.01)
    *H01L 21/66*     (2006.01)
    *H01L 21/687*     (2006.01)

(52) U.S. Cl.
    CPC .... *H01L 21/02381* (2013.01); *H01L 21/0254* (2013.01); *H01L 21/0262* (2013.01); *H01L 21/68764* (2013.01); *H01L 22/26* (2013.01)

(58) Field of Classification Search
    CPC ......... H01L 21/67748; H01L 21/67751; H01L 21/68742; H01L 21/02381; H01L 21/0254; H01L 21/0262; H01L 21/68764; H01L 22/26; H01L 21/67098; H01L 21/67115; C23C 14/35; C23C 14/50; C23C 14/56; C23C 16/52; C23C 16/4584; C23C 16/46; C23C 16/45502; H01J 37/32513; H01J 37/32715; H01J 37/3405; H01J 37/3426; H01J 2237/2007; H01J 2237/332; G01B 11/306; G01B 11/24; C30B 25/10

See application file for complete search history.

(56) References Cited

U.S. PATENT DOCUMENTS

| | | | | |
|---|---|---|---|---|
| 7,573,004 B1* | 8/2009 | Tompa | | H01L 21/67103 219/461.1 |
| 2003/0183613 A1* | 10/2003 | Takano | | H01L 21/67248 219/390 |
| 2003/0232561 A1* | 12/2003 | Yawata | | B32B 37/10 445/24 |
| 2005/0013937 A1* | 1/2005 | Cook | | H01L 21/02532 257/E21.101 |
| 2005/0233547 A1* | 10/2005 | Noda | | H01L 21/6835 438/459 |
| 2005/0286058 A1* | 12/2005 | Belousov | | G01B 11/24 356/612 |
| 2006/0241891 A1* | 10/2006 | Kaushal | | H01L 21/67248 702/136 |
| 2006/0252233 A1* | 11/2006 | Honma | | H01L 21/67132 438/464 |
| 2010/0032087 A1* | 2/2010 | Takahashi | | H01L 21/67132 428/335 |
| 2010/0180814 A1* | 7/2010 | Wu | | C30B 23/002 117/3 |
| 2011/0012127 A1 | 1/2011 | Tanaka | | |
| 2011/0073039 A1* | 3/2011 | Colvin | | C23C 16/46 219/490 |
| 2011/0247556 A1* | 10/2011 | Raring | | C23C 16/45587 118/713 |
| 2012/0052659 A1* | 3/2012 | Moriyama | | C30B 25/10 118/696 |
| 2012/0304926 A1 | 12/2012 | Boguslavskiy et al. | | |
| 2013/0047916 A1* | 2/2013 | Nishibayashi | | C30B 25/10 118/712 |
| 2013/0343426 A1 | 12/2013 | Gurary et al. | | |
| 2014/0261187 A1 | 9/2014 | Krishnan et al. | | |
| 2014/0326186 A1 | 11/2014 | Paranjpe et al. | | |
| 2015/0340265 A1* | 11/2015 | Rudmann | | B32B 37/12 156/285 |
| 2016/0148803 A1* | 5/2016 | Wu | | H01L 21/67248 118/712 |
| 2016/0351426 A1 | 12/2016 | Kwon | | |
| 2016/0355947 A1* | 12/2016 | Dobrinsky | | C30B 25/10 |
| 2017/0051184 A1* | 2/2017 | Yoo | | C09J 7/381 |
| 2017/0098539 A1* | 4/2017 | Shatalov | | C23C 16/46 |
| 2019/0371578 A1* | 12/2019 | Larosa | | H01J 37/3244 |
| 2022/0074869 A1* | 3/2022 | Arora | | G01B 11/06 |

FOREIGN PATENT DOCUMENTS

| | | |
|---|---|---|
| JP | 9126913 A | 5/1997 |
| JP | 2002246318 A | 8/2002 |
| JP | 2008159759 A | 7/2008 |
| JP | 2009295685 A | 12/2009 |
| JP | 2011246749 A | 12/2011 |
| JP | 2012101977 A | 5/2012 |
| WO | 2018069387 A1 | 4/2018 |

OTHER PUBLICATIONS

International Search Report and Written Opinion in corresponding International Application No. PCT/SE2020/050367 mailed May 19, 2020 (9 pages).

\* cited by examiner

DEVICE AND METHOD FOR ENSURING PLANARITY OF A SEMICONDUCTOR WAFER DURING EPITAXIAL GROWTH

CROSS-REFERENCE TO RELATED APPLICATIONS

This application is a U.S. National Stage application of PCT/SE2020/050367, filed Apr. 8, 2020 and published on Oct. 15, 2020 as WO 2020/209780, which claims the benefit of Swedish Patent Application No. SE1930124-1 filed Apr. 12, 2019, all of which are hereby incorporated by reference in their entireties.

TECHNICAL FIELD

The present invention relates to a device which during growth of a wafer of a semiconducting material in a growth chamber under high temperature monitors a predetermined planarity for the wafer being achieved during the growth process.

PRIOR ART

When manufacturing semiconducting materials by means of Chemical Vapour Deposition (CVD) it is important that the material obtains homogeneous qualities. The qualities obtained are depending on different conditions prevailing under the growth process, often called the growth of the material.

The growth comes about on a wafer which is usually located on a base disc (susceptor) being manufactured from a solid material, as an example graphite. During the growth occurring at an elevated temperature in a growth chamber, the wafer is especially heated by the susceptor. Gases, including the vapours containing the elements needed for the growth, i.e. for the generation of the crystal structure strived at in the semiconducting material, are let into the chamber in a controlled way. The wafer is usually rotated during the growth. In some cases, the wafer will bend during the growth process. This can be caused by an uneven temperature around the wafer, internal stresses in the wafer, or stresses generated by the growth that has occurred on the wafer. Normally, the internal stresses are a material characteristic which cannot be determined before the start of the growth process.

For a wafer with a greater diameter the bending may cause devastating cracks when the wafer is cooled down to room temperature again when the growth process has ended. When the wafer tries to return to its original shape the internal stresses increase due to the added growth layer and the inner stresses cannot become offset by the changed distances between the crystal planes built by the atoms from the gases used to accomplish a predetermined semiconductor material. This causes occurrence of cracks in the grown material.

Methods to measure the bending of a wafer and to control it during the growth process exist. The bending can be compensated, for example by generation of a force which produces a bending in an opposite direction by means of a modified distribution between different gases in the growth chamber. But when the distribution between different gases are changed the characteristics of the semiconductor being produced will also become changed in an undesired way.

Patent document EP 1275135 is supposed to constitute closest prior art within related technical field. In said document something is mentioned about arranging different temperature zones in the gases before and after the gas flow over the wafer in order to create requirements for avoiding bending of the wafer. On the other hand nothing is mentioned in said document about detection of possible deviation of the planarity of the wafer during the growth process as well as any arrangements to counteract in real time bending of the wafer based on detected deviation from the planarity of the wafer.

DESCRIPTION OF THE INVENTION

The invention constitutes, according to one aspect, a device to ensure planarity of a semiconductor wafer during growth at an increased temperature in a growth chamber where the device is contained in a reactor housing enclosing the growth chamber, and where the growth chamber has a port to enable depositing at least one wafer on a rotating susceptor inside the growth chamber and for withdrawal of the wafer from the growth chamber, where the growth chamber further has an inlet channel for supplying process gases and an outlet channel for discharging not consumed process gases in order to create a process gas flow between said channels, where separate heaters are arranged adjacent to the growth chamber for heating the rotating wafer be means of individually controlled heating zones both above and below the wafer. Further, an instrument is arranged to measure the bending of the wafer in at least one position. An automatic control circuit uses data from temperature sensors and the instrument which measures the bending and changes the temperature in said heating zones in such a way that the bending of the wafer is minimized.

The measurement of the bending of the wafer can be done with an optical method, for example according to EpiCurve®TT Gen 3. As the magnitude of the bending depends on the diameter of the wafer it is often expressed as the radius of the bending, indicated as $km^{-1}$. The greater value of the radius the less is the bending. The measurement method tested in connection with the present invention today manages to measure convex radii which amounts to 7000 $km^{-1}$ and in the case with concave radii up to 800 $km^{-1}$. In a growth process the bending radius is often around 50 $km^{-1}$, i.e. well within what the measurement method manages to determine. The bending is measured at positions independent of each other at different distances from the centre of the wafer by measuring the reflection of laser beams which are sent towards the wafer. By measurements of the difference between angles of reflected beams at their reflection from two different positions the bending can be determined. The bending of the wafer is continuously measured.

The heater temperatures are adjusted by means of the automatic control circuit at certain time intervals, which can be done in periods of 30 seconds. The adjustment is made according to a table value in relation to the measured bending. If the bending is concave, i.e. the edges of the wafer are higher than the central parts of the wafer, the temperature at the upper side shall generally be raised in relation to the underside. It is herein mentioned that the heaters are arranged adjacent to the growth chamber. The concept "separate heaters" is herein referred to by heaters where their temperatures are measured and their power controlled individually in relation to each other.

The susceptor rotates around a shaft which is perpendicularly arranged in relation to the gas flow above the susceptor. The design of the heaters is not given, instead they can be arranged according to the conduct of the gas flow in the growth chamber. In the solution disclosed herein a horizontally gas flow is shown where the flow of process gases principally passes horizontally across the horizontally arranged susceptor having one or more wafers on its surface. The process gases can in other applications be introduced centrally above the susceptor and be pumped away in the direction of its circumference. Today a plurality of methods are used for the configuration of a process gas flow.

The process gases incoming to the growth chamber cool the susceptor whereby the heaters must be designed according to the behaviour of the gas flow. Heaters above and under the susceptor are individually controlled. In the disclosed embodiment of the present invention straight heaters extending perpendicularly to the horizontal gas flow through the growth chamber are used wherein the heaters are located both above and under the susceptor. The principle of the device according to the invention may as well be used for other designs of the growth chamber, the location of the susceptor, and the flows of the process gases by arranging the heaters so that their design give a possibility to establish controlled heat zones above and under the susceptor and thereby above and under a wafer during growth.

When the wafer tends to bend due to inner stresses or stresses generated by the added growth layer the wafer can hereby be kept flat by establishing a controlled change of the temperature profile across the entire surface of the wafer. This process is automatically monitored in a feedback control circuit.

DESCRIPTION OF EMBODIMENTS

In the following, a number of embodiments of the invention will be described by reference to the accompanying drawings. The drawings show the principle of the invention only schematically and do not claim to show any proportions between different elements thereof according to scale.

An embodiment of a device according to the invention is presented here. As mentioned, a configuration of a growth chamber and channels for process gases can be designed in different ways. By adapting the elements shown in the embodiment presented herein to other designs of reactors the principle for the present invention can be transferred to these.

Figure 1:
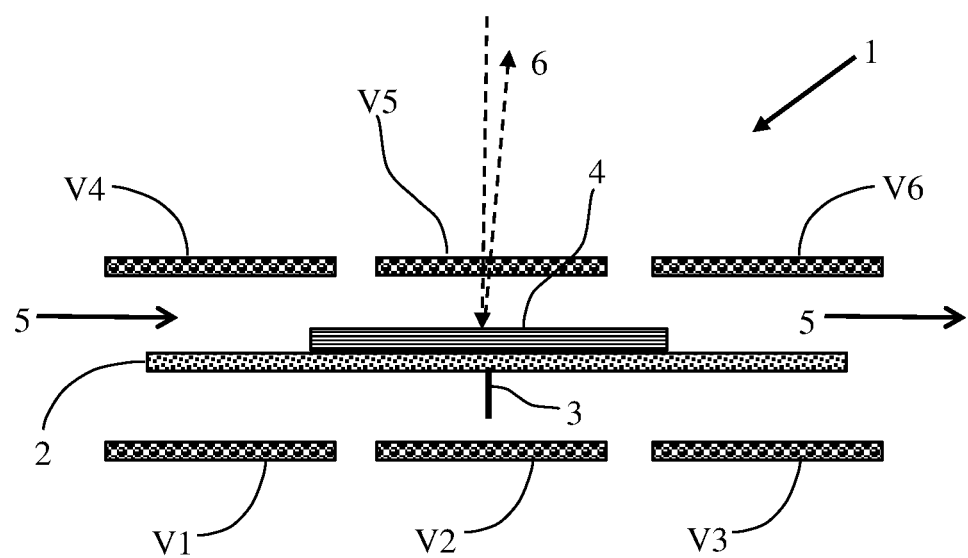
FIG. 1 shows a schematic picture of the device according to the aspect of the invention.

FIG. 1 shows only the inner elements being used in a reactor for growing layers of a semiconductor material on a wafer. The depicted example of the device is used in a reactor for growing gallium nitride on silicon. This type of growth requires very high temperatures, usually between 900 and 1500 degrees Celsius, whereby the defects in the crystal material discussed above may arise. The device according to the invention is referred to as 1. In this, a susceptor 2 being arranged to rotate around a shaft 3 is illustrated. On the susceptor 2 a wafer 4 is positioned, whereby the wafer rotates together with the susceptor. The growth of a semiconductor material occurs on the upper side of the wafer 4. In the figure, process gases being used for the growth of the semiconductor material are shown flowing from left in a horizontal direction towards an outlet to the right in the figure. The process gas flow is referred to by reference number 5. Heaters are arranged both below and above the susceptor 2, in the illustrated example arranged as 6 different heaters being denoted by V1, V2, V3, V4, V5, V6. The heaters are as an example produced as graphite elements. The bending of the wafer is measured, as mentioned, by means of laser light 6 which is directed in between the heaters towards at least one slightly central point of the wafer and one slightly peripheral point of the wafer, though with a very small distance between said points.

Figure 2:
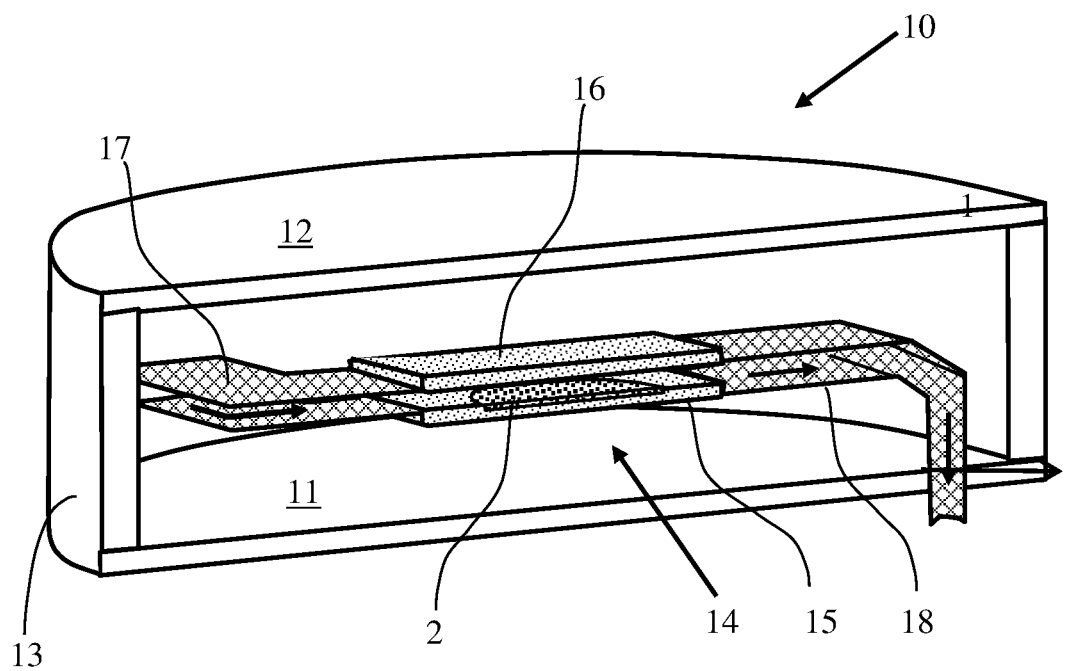
FIG. 2 schematically illustrates a perspective view of a device according to the invention where the reactor, the growth chamber and the channels for the process gases are given in a longitudinal cross section through the growth chamber when the device is arranged in an exemplified reactor.

The device 1 is shown, very schematically, inside a reactor 10 in FIG. 2, where the reactor is configured with a cylindrical housing being designed with a bottom 11, lid 12 and cylindrical wall 13. A reactor according to FIG. 2 is usually made by stainless steel. The figure depicts a cross section through the reactor 10, whereby inside this a growth chamber 14 opened into a longitudinal cross section is easily revealed. The growth chamber is made by a very heat resistant material. The growth chamber 14 can herein be found with a bottom 15 and an upper wall 16. The susceptor 2 is shown submerged into the bottom 15 of the growth chamber, where it is rotatably arranged in the same plane as the susceptor. The reactor 10 has a port for supply of process gases, which are let into the growth chamber 14 via an inlet channel 17, where the process gases are symbolized by means of an arrow inside the inlet channel 17. Further, the reactor 10 has a port for the export of unused process gases, where these are let out via an outlet channel 18 from the growth chamber 14. In this outlet channel 18 this flow of unused process gases is shown by an arrow inside the outlet channel 18. The heaters V1-V6 are for the sake of clarity not shown in FIG. 2.

Figure 3:
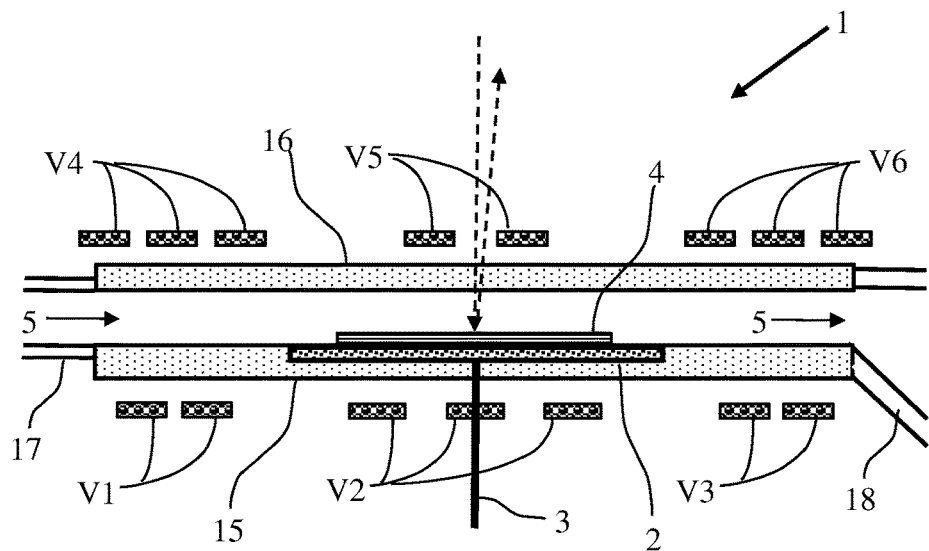
FIG. 3 shows a longitudinal cross section through the growth chamber according to FIG. 2, wherein now the locations of the heaters in relation to growth chamber and wafer are depicted.

A heater configuration V1-V6 arranged in the device 1 applied in reactor 10 according to the example in FIG. 2 is visualized in FIG. 3. It can be understood from this figure that 3 groups of heaters are disposed by heaters both below the bottom 15 and above the upper wall 16 of the growth chamber. The heaters V1-V6 are organized in groups. The growth chamber is thus heated upon the inflow of the process gases into the growth chamber by means of heaters V1 and V4 of a first group. A second group of heaters, V2 and V5, heats the growth chamber 14 in its central part, while a third group of heaters, V3 and V6, heats the growth chamber at the outflow of process gases from the growth chamber. The process gases are here denoted by 5 at the arrows. Hereby, the placement of these heaters V1-V6 at different positions in relation to the extent of the growth chamber 14 lengthwise, supply of heat to the centre part of the wafer 4 and its peripheral parts can be controlled and varied independent of each other in that the heater groups are individually controlled with respect to supply of energy to these. The temperature of upper or lower part of the growth chamber 14 can also be controlled at the respective heater group by the control of upper and lower heater of a heater group independent of each other. The heaters V1-V6 are in the embodiment configured by graphite elements.

Figure 4:
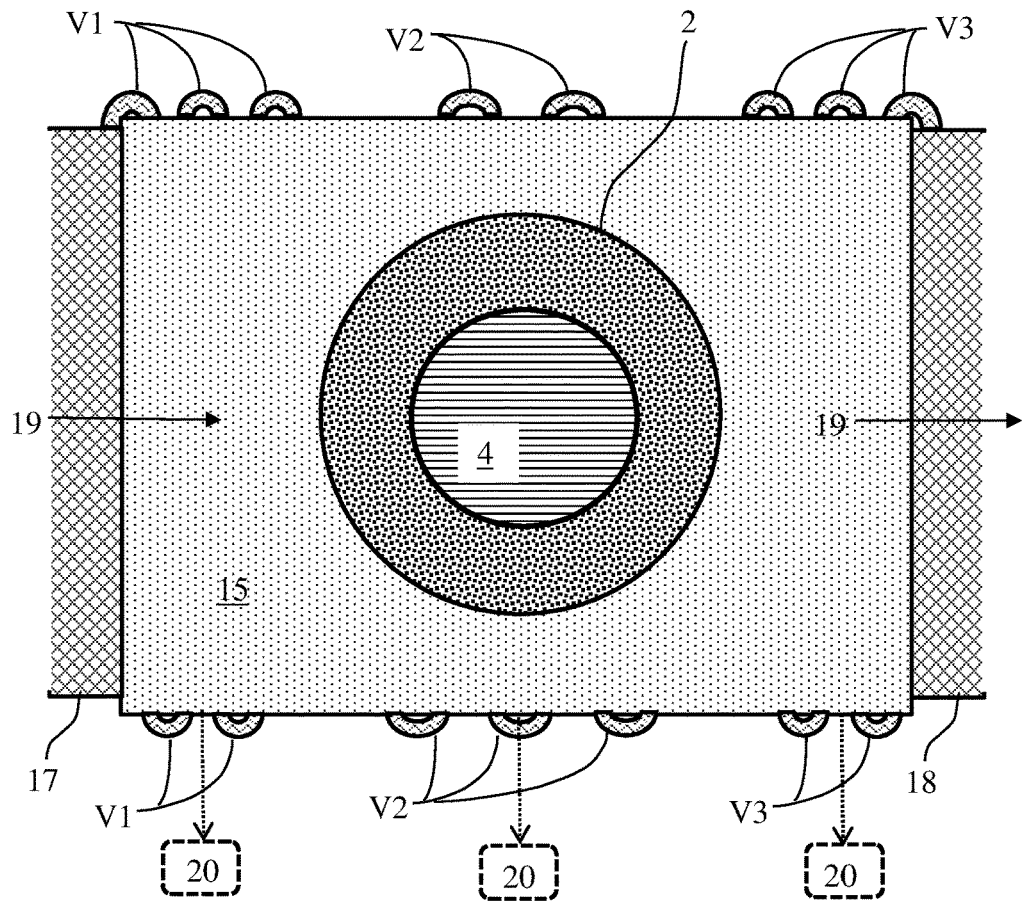
FIG. 4 shows in a plan view from above the lower half of the growth chamber according to FIG. 3, wherein susceptor, wafer and the groups of heaters under the growth chamber appear.

FIG. 4 shows the bottom 15 of the growth chamber 14 in a plan view from above. Here it can be clearly read how the different heater groups heat different parts of the growth chamber 14 and thus demonstrates how changes of supply of heat to wafer 4 is established. An automatic control circuit (not shown) detects bending values and thereafter controls feeding of energy to the heaters V1-V6, whereupon a supervised temperature profile is accomplished across the whole surface of the wafer 4 in order to maintain a planar wafer. If, for example measures of bending of a wafer positioned on the susceptor 2 indicate that the edges of the wafer 4 are higher than the central parts of the wafer the automatic control circuit will rise the temperature on the upper side of the wafer at the outer parts thereof, whereby bending of the edges of the wafer upwards will be counteracted. This is accomplished through increased energy supply in heaters V4 and V6 or by lowered energy supply via the heaters V1 and V3.

There is illustrated in FIG. 3 how laser light according to the prior art measurement method is directed towards a position on the wafer. By measuring the angle created between the light beam incident on the wafer and the reflected beam according to reference 6 and comparison with the corresponding angle for another light beam directed to a different position on the wafer any bending of the wafer can be determined and thus counteracted by automatic adjustment of energy supply to the different heaters. This control is carried out via said control circuit. Bending values are obtained by the measurement method.

The measurement of temperatures is made by an optical method (use of pyrometers). There is one temperature sensor 20 in the form of a pyrometer for each heater. The pyrometer measures perpendicularly to the direction of the flow of the gases. The pyrometer is located outside the growth chamber and measures through an optical window. This is illustrated by arrows from the temperature sensors 20 that are outside the growth chamber. The measurement is not done directly against the heater but against the bottom (15) and the upper wall (16).

Instead of measuring the temperature in the growth chamber, data regarding the applied power to the heaters can be determined. Measured power data are hereby used as a control means for the control circuit together with bending values.

The electric energy supplied to the heaters V1-V6 is introduced through the outer cylindrical wall 13 of the reactor 10 via vacuum-tight electrical bushings. These bushings further keep the heaters on their locations. Between the heaters and the cold outer wall there is isolation that withstands the process gases and the high temperature inside the reactor.

The invention claimed is:

1. Device to ensure planarity of a semiconductor wafer during growth at an increased temperature in a growth chamber arranged in a reactor housing where the device includes:
    a growth chamber having a port to allow the deposition of at least one wafer on a rotating susceptor in the growth chamber and the withdrawal of the wafer from the growth chamber, where the growth chamber further has an inlet channel for a supply of process gases and an outlet channel for a discharge of not consumed process gases in order to create a process gas flow between said channels,
    separate heaters are arranged adjacent to the growth chamber to heat the rotating wafer by means of individually controlled heating zones both above and under the wafer,
    an instrument arranged to measure the bending of the wafer,
    an automatic control circuit is arranged to use data from any one of:
        a) temperature sensors
        b) measured data of the power to the heaters, and
        c) the instrument measuring bending of the wafer,
            to change the temperature in said individually controlled heating_zones so that bending of the wafer is minimized;
        wherein the device comprises three heaters positioned below the growth chamber and three heaters positioned above the growth chamber, the heaters being arranged in groups.

2. The device according to claim 1, whereby the growth chamber is heated at the inflow of the process gases into the growth chamber with a first and a fourth heater in a first group of heaters; a second and a fifth heater in a heater group of heaters heat the growth chamber in its central part; while a third and a sixth heater in a third group of heaters heat the growth chamber at the process gases outflow from the growth chamber.

3. The device according to claim 1, where the wafer bending is measured by an instrument which calculates the bending by means of laser light sent towards the wafer and reflected from at least two points on the wafer surface.

4. The device according to claim 3, wherein the instrument is arranged to calculate an angle between a laser beam incident to the wafer and the laser beam reflected from the wafer at at least two points on the wafer and to calculate therefrom if bending of the wafer is present.

5. Method to ensure planarity of a semiconductor wafer during growth at an increased temperature in a device according to claim 1, comprising the steps of:
    measuring bending of the wafer by an instrument sending laser beams towards the wafer,
    adjusting, by an automatic control circuit, the supply of energy to one or some of the heaters to counteract initiated measured bending.

6. The method according to claim 5, further comprising the step of:
    individual heaters are controlled individually with respect to energy supply to them.

7. The method according to claim 6, further including the step of:
    the temperature of the upper or lower part of the growth chamber is controlled by controlling the upper and lower heaters independently of one another.

8. The method according to claim 7, further including the step of:
    when indication at a bending measurement that the edges of the wafer are higher than the central parts thereof, the automatic control circuit ensures that the temperature is raised at the upper side of the wafer in the outer parts thereof by means of increased energy supply to anyone of heaters located above the wafer at the outer parts thereof.

9. The method according to claim 8, further including the step of:
    when indication at a bending measurement that the edges of the wafer are lower than the central parts thereof, the automatic control circuit ensures that the temperature is raised at the lower side of the wafer in the outer parts thereof by means of increased energy supply to anyone of heaters located under the wafer at the outer parts thereof.

* * * * *

UNITED STATES PATENT AND TRADEMARK OFFICE
CERTIFICATE OF CORRECTION

| | | |
|---|---|---|
| PATENT NO. | : 12,180,592 B2 | Page 1 of 1 |
| APPLICATION NO. | : 17/594235 | |
| DATED | : December 31, 2024 | |
| INVENTOR(S) | : Roger Nilsson et al. | |

It is certified that error appears in the above-identified patent and that said Letters Patent is hereby corrected as shown below:

On the Title Page

In the Assignee item (73), replace EPILUVAC AB (Lund, SE); with -- Veeco SiC CVD Systems AB (Lund, SE) --

Signed and Sealed this
Eighth Day of April, 2025

Coke Morgan Stewart
*Acting Director of the United States Patent and Trademark Office*